(12) United States Patent
Chang Chien et al.

(10) Patent No.: US 7,750,362 B2
(45) Date of Patent: Jul. 6, 2010

(54) SEMICONDUCTOR LIGHT-EMITTING DEVICE

(75) Inventors: Chien-Lin Chang Chien, Taipei (TW); Hung-Yuan Su, Taipei (TW); Chen-Hsiu Lin, Taipei (TW)

(73) Assignees: Silitek Electronic (Guangzhou) Co., Ltd., Guangzhou (CN); Lite-On Technology Corp., Taipei (TW)

( * ) Notice: Subject to any disclaimer, the term of this patent is extended or adjusted under 35 U.S.C. 154(b) by 134 days.

(21) Appl. No.: 12/230,193

(22) Filed: Aug. 26, 2008

(65) Prior Publication Data

US 2009/0242915 A1 Oct. 1, 2009

(30) Foreign Application Priority Data

Mar. 25, 2008 (CN) .................. 2008 1 0027087

(51) Int. Cl.
*H01L 33/00* (2010.01)
(52) U.S. Cl. .................. 257/99; 257/98; 257/E33.061
(58) Field of Classification Search .................. 257/98, 257/99, E33.061
See application file for complete search history.

(56) References Cited

U.S. PATENT DOCUMENTS

| 2008/0142822 A1* | 6/2008 | Kim et al. .................. 257/98 |
| 2009/0015137 A1* | 1/2009 | Su et al. .................. 313/503 |
| 2010/0044737 A1* | 2/2010 | Kobayakawa .................. 257/98 |

FOREIGN PATENT DOCUMENTS

TW 315528 7/2007

* cited by examiner

*Primary Examiner*—David S Blum
(74) *Attorney, Agent, or Firm*—Rosenberg, Klein & Lee

(57) ABSTRACT

A semiconductor light-emitting device includes: a hollow body including a bottom wall and a surrounding wall cooperating with the bottom wall to define an encapsulant-receiving recess, the bottom wall being formed with a through-hole, the surrounding wall having a diffuse surface that surrounds the encapsulant-receiving recess; a heat-dissipating body provided on a bottom side of the bottom wall and covering the through-hole in the bottom wall; a light-emitting chip disposed in the through-hole in the bottom wall; a transparent encapsulant filling the encapsulant-receiving recess and the through-hole; and a wavelength-converting layer covering the transparent encapsulant.

20 Claims, 2 Drawing Sheets

_US 7,750,362 B2_

SEMICONDUCTOR LIGHT-EMITTING DEVICE

CROSS-REFERENCE TO RELATED APPLICATION

This application claims priority of Chinese application no. 200810027087.6, filed on Mar. 25, 2008.

BACKGROUND OF THE INVENTION

1. Field of the Invention

This invention relates to a semiconductor light-emitting device, more particularly to a semiconductor light-emitting device having a function of diffusing light so as to enhance light extraction efficiency thereof.

2. Description of the Related Art

A conventional semiconductor light-emitting device usually uses light emitting diode(s) (LEDs) as a light source, and a fluorescent layer which includes fluorescent powders that are excited to emit light of a predetermined color when the LED is activated.

Currently, the fluorescent layer is normally applied to the semiconductor light-emitting device by a "conformal coating" method or a "remote phosphor" method. In the "conformal coating" method, the fluorescent layer containing fluorescent powders is disposed to surround the LED chip. In the "remote phosphor" method, the fluorescent layer is disposed above and is spaced apart from the LED chip. According to a paper by N. Narendran, Y. Gu, J. P. Freyssinier-Nova, and Y. Zhu, phys.stat.solidi (a) 202 (6), R60-R62, entitled, "Extracting phosphor-scattered photons to improve white LED efficiency", since the fluorescent powders in the fluorescent layer function as point light sources, a large part of the light (about 60%) excited by the fluorescent powders would go back to and be absorbed by the LED chip. As disclosed in Taiwanese Patent no. 315528, the conventional LED chip is disposed on a trough-shaped reflector to reflect the light emitted from the LED chip. The semiconductor light-emitting device of the aforesaid patent is provided with a fluorescent layer using the "remote phosphor" method.

However, the aforesaid reflector can also focus the light emitted from the fluorescent layer on the LED chip, thereby resulting in absorption of the light reflected from the reflector by the LED chip, and in a decrease in the light extraction efficiency of the LED.

Moreover, since the surface of the aforesaid reflector is relatively smooth, an adhesion force between the reflector and an encapsulant that fills a space between the reflector and the LED chip is relatively weak, and moisture is likely to penetrate into the semiconductor light-emitting device, which has an adverse effect on performance of the semiconductor light-emitting device.

Therefore, it is important to improve the light extraction efficiency and the reliability of the semiconductor light-emitting device with the "remote phosphor" type fluorescent layer.

SUMMARY OF THE INVENTION

Therefore, an object of the present invention is to provide a semiconductor light-emitting device with improved light extraction efficiency and reliability.

Accordingly, the semiconductor light-emitting device of the present invention comprises: a hollow body including a bottom wall and a surrounding wall extending upwardly from a periphery of the bottom wall, the bottom wall being formed with a through-hole, the surrounding wall cooperating with the bottom wall to define an encapsulant-receiving recess in spatial communication with the through-hole, the surrounding wall having a diffuse surface that surrounds the encapsulant-receiving recess and that has a reflectivity composed of a diffuse reflectivity and a specular reflectivity, the diffuse reflectivity being larger than the specular reflectivity; a heat-dissipating body provided on a bottom side of the bottom wall and covering the through-hole in the bottom wall; a light-emitting chip disposed in the through-hole in the bottom wall for generating a light in the hollow body, and supported on the heat-dissipating body; a transparent encapsulant filling the encapsulant-receiving recess and the through-hole to enclose the light-emitting chip; and a wavelength-converting layer that is capable of converting the wavelength of the light into a desired wavelength and that covers the transparent encapsulant.

BRIEF DESCRIPTION OF THE DRAWINGS

Other features and advantages of the present invention will become apparent in the following detailed description of the preferred embodiment of the invention, with reference to the accompanying drawings, in which.

DETAILED DESCRIPTION OF THE PREFERRED EMBODIMENT

Figure 1:
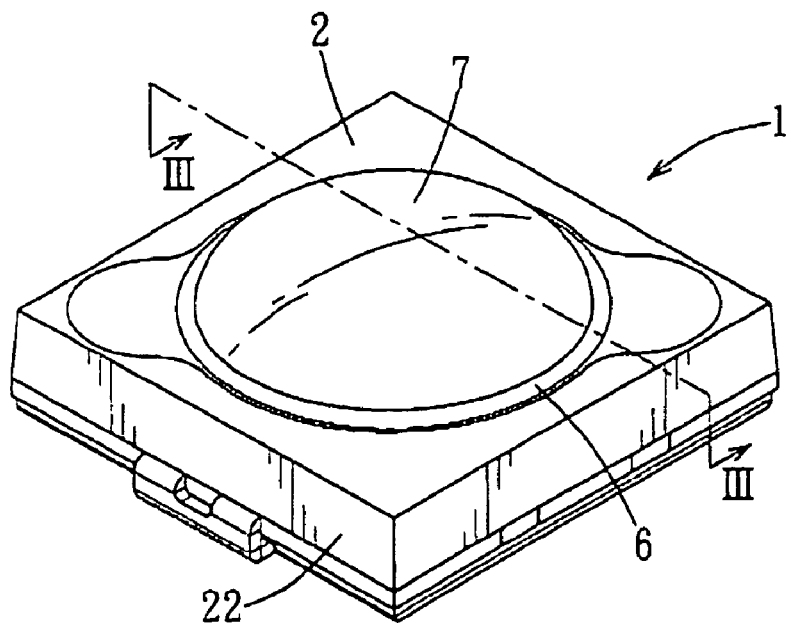
FIG. 1 is a top perspective view of the preferred embodiment of a semiconductor light-emitting device according to the present invention.
Figure 2:
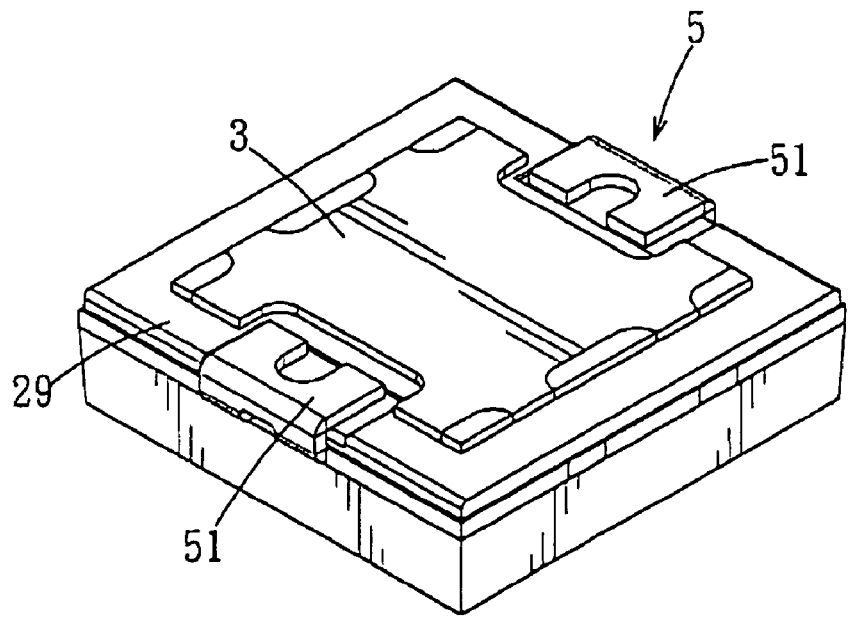
FIG. 2 is a bottom perspective view of the preferred embodiment.

According to geometrical optics, when light is emitted from a light source toward a medium, part of it would be reflected by the medium, part of it would pass through the medium, and part of it would be absorbed by the medium. The relationship between light and the medium satisfies the following equation:

$$\text{Reflectivity} + \text{Transparency} + \text{Absorptivity} = 1$$

The reflectivity is composed of a diffuse reflectivity and a specular reflectivity. The diffuse surface defined hereinafter in the present invention is a surface that has a diffuse reflectivity larger than the specular reflectivity when reflection of light occurs on the diffuse surface. In other words, as long as a surface has a diffuse reflectivity larger than the specular reflectivity, the surface can be regarded as a diffuse surface.

Referring to FIGS. 1 to 4, the semiconductor light-emitting device 1 of the preferred embodiment of the present invention is shown to include a hollow body 2, a heat-dissipating body 3, a light-emitting chip 4, a lead frame 5, a transparent encapsulant 6, and a wavelength-converting layer 7.

The hollow body 2 includes a bottom wall 21 and a surrounding wall 22 extending upwardly from a periphery of the bottom wall 21. The bottom wall 21 is formed with a through-hole 23 at a center part thereof. The surrounding wall 22 cooperates with the bottom wall 21 to define an encapsulant-receiving recess 24. The through-hole 23 in the bottom wall 21 is in spatial communication with the encapsulant-receiving recess 24, and has a rectangular periphery. The surrounding wall 22 has a diffuse surface 25 that surrounds the encapsulant-receiving recess 24. Moreover, the bottom wall 21 of the hollow body 2 is preferably formed with a light-blocking protrusion 26 protruding from the periphery of the through-hole 23 into the encapsulant-receiving recess 24 for blocking a scattered light reflected from the diffuse surface 25 from entering the through-hole 23 in the bottom wall 21. The bottom wall 21 has a bottom side 28 opposite to the surrounding wall 22 and formed with an accommodating recess 27 in spatial communication with the through-hole 23.

Figure 3:
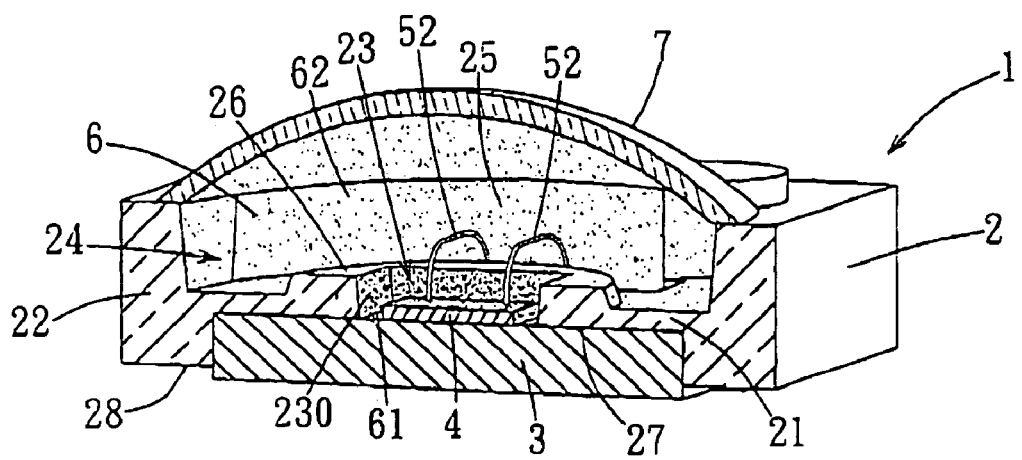
FIG. 3 is a cross-sectional view taken along line III-III in FIG. 1.
Figure 4:
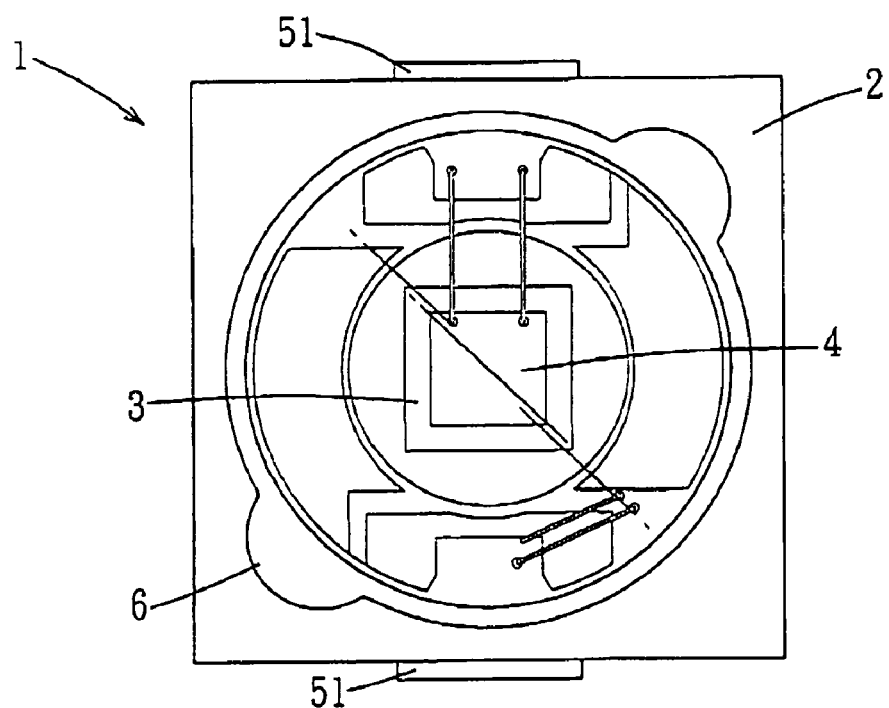
FIG. 4 is a schematic top view of the preferred embodiment.

The heat-dissipating body 3 is provided on the bottom side 28 of the bottom wall 21, is fitted into the accommodating recess 27, and covers the through-hole 23 in the bottom wall 21. The heat-dissipating body 3 is made from a metallic material for heat dissipation. For example, the metallic material can be gold, silver, copper, aluminum, brass, or steel. The size and position of the heat-dissipating body 3 can be modified according to the actual design of the semiconductor light-emitting device 1. For example, as shown in FIG. 3, a part of the heat-dissipating body 3 is exposed from the through-hole 23.

The light-emitting chip 4 is disposed in the through-hole 23 in the bottom wall 21 for generating a light in the hollow body 2, and is supported on and contacts directly the heat-dissipating body 3, thereby transmitting the heat generated from the light-emitting chip 4 to the outside environment. Furthermore, the light-emitting chip 4 can be any one of commercially available light emitting diode chips, e.g., a GaN light emitting diode chip, or a surface-treated light emitting diode chip, such as a silicon oxide covered GaN light emitting diode chip. The refractive index of the silicon oxide is about 1.8.

The lead frame 5 is disposed on an exterior 29 of the hollow body 2, is coupled to the light-emitting chip 4, and includes two frame elements 51 and a plurality of metal wires 52. The frame elements 51 are respectively disposed on two opposite sides of the heat-dissipating body 3, and are spaced apart from the heat-dissipating body 3. The metal wires 52 are connected to the light-emitting chip 4 and the two frame elements 51, respectively. The frame elements 51 of the lead frame 5 are adapted to connect the light-emitting chip 4 to an external circuit (not shown) through the metal wires 52. Moreover, since the lead frame 5 and the heat-dissipating body 3 are spaced apart from each other, the electric current and the heat-dissipating flow generated in the semiconductor light-emitting device 1 are separated into two different paths, thereby preventing electric leakage from occurring through the heat-dissipating body 3.

The transparent encapsulant 6 fills the encapsulant-receiving recess 24 and the through-hole 23 to enclose the light-emitting chip 4, and has a refractive index not greater than those of the wavelength-converting layer 7 and the light-emitting chip 4.

The wavelength-converting layer 7 is capable of converting the wavelength of the light generated by the light-emitting chip 4 into a desired wavelength, and covers the transparent encapsulant 6. The wavelength-converting layer 7 is made from a material selected from one of a fluorescent layer and a phosphorous-containing layer. In other words, the wavelength-converting layer 7 contains fluorescent powders or phosphor powders, which can absorb part of light emitted from the light-emitting chip 4 so as to emit fluorescent light or phosphorescence.

In the preferred embodiment, the transparent encapsulant 6 includes a transparent outer encapsulant layer 62 filling the encapsulant-receiving recess 24, and a transparent inner encapsulant layer 61 filling the through-hole 23. The outer encapsulant layer 62 has a refractive index less than those of the wavelength-converting layer 7 and the inner encapsulant layer 61.

In some preferred embodiments, the transparent encapsulant 6 is made from a high transmittance material, which has a transmittance of more than 80%, for example, a resin or a gel material. Preferably, the high transmittance material is epoxy resin or silica gel. In a preferred embodiment, if the silica gel having the refractive index of 1.5 is used for the inner encapsulant layer 61, the outer encapsulant layer 62 can be made from silica gel having the refractive index of 1.4. As for the wavelength-converting layer 7, the refractive index thereof should be greater than that of the outer encapsulant layer 62. In a preferred embodiment, the wavelength-converting layer 7 is made from a mixture of a silica gel having a refractive index of 1.5 and a YAG (yttrium aluminum garnet) fluorescent powder that has a refractive index of 1.8. The mixture thus formed has a refractive index ranging from 1.5 to 1.8.

Although the wavelength-converting layer 7 employed in the example in the present invention is a fluorescent layer formed from a mixture of the silica gel and the fluorescent powder, the wavelength-converting layer 7 is not limited to the fluorescent layer. For example, the fluorescent layer can be replaced by a phosphorous-containing layer that is made from a mixture of the silica gel and a phosphor powder.

In the present invention, it should be noted that, by making the diffuse surface 25 with a high diffuse reflectivity, the undesired situation that the light emitted from the wavelength-converting layer 7 is focused on and absorbed by the light-emitting chip 4 can be prevented in the present invention. In the preferred embodiment, the diffuse surface 25 is a roughened surface. Furthermore, the bottom wall 21 and the surrounding wall 22 of the hollow body 2 are an integral single piece, and are made from a composite of a polymer material and a glass fiber. Accordingly, the diffuse surface 25 defining the encapsulant-receiving recess 24 and a hole-defining wall 230 defining the through-hole 23 are inherently roughened due to the presence of the glass fibers in the polymer material, and the adhesion force between the diffuse surface 25 and the transparent encapsulant 6 can be enhanced so as to prevent penetration of moisture into the semiconductor light-emitting device 1. As such, by virtue of the roughened surface, not only is the possibility for the light reflected back to the light-emitting chip 4 significantly decreased, the semiconductor light-emitting device with a high reliability can also be achieved. Preferably, the polymer material of the single piece of the bottom wall 21 and the surrounding wall 22 of the hollow body 2 is made from a material having at least one functional group of epoxy group, $C_1$-$C_6$ alkyl group, phenyl group, and amino group, for further strengthening the adhesion force between the hollow body 2 and the transparent encapsulant 6.

In use, the light-emitting chip 4 is activated by an external circuit (not shown) via the lead frame 5, and emits light in a specified wavelength range. A portion of the light emitted from the light-emitting chip 4 can be absorbed by the wavelength-converting layer 7 so as to emit fluorescent light, and the remainder of the light is reflected by the wavelength-converting layer 7. A portion of the fluorescent light thus formed and a portion of the reflected light from the wavelength-converting layer 7 travel to the diffuse surface 25, and are diffused by the diffuse surface 25, thereby considerably reducing the probability for the light, which is reflected from the diffuse surface 25, to be directed toward the light-emitting chip 4. In addition, the light-blocking protrusion 26 can also block the light reflected from the diffuse surface 25 and the light from the wavelength-converting layer 7 from entering into the through-hole 23 in the bottom wall 21 and thus can further reduce the probability for the light reflected from the diffuse surface 25 and the light from the wavelength-converting layer 7 from being absorbed by the light-emitting chip 4.

Furthermore, the outer encapsulant layer 62 has a refractive index not greater than that of the wavelength-converting layer 7 so as to increase the total internal reflection of the light emitted from the wavelength-converting layer 7 toward the outer encapsulant layer 62. By making the refractive index of the inner encapsulant layer 61 larger than that of the outer encapsulant layer 62 and slightly smaller than that of the light-emitting chip 4, the total internal reflection of the light emitted from the light-emitting chip 4 toward the transparent encapsulant 6 can be decreased. By decreasing the probability for the light being returned back to the light-emitting chip 4 and by increasing the total internal reflection of the light emitted from the wavelength-converting layer 7, the light extraction efficiency of the semiconductor light-emitting device 1 of the present invention can be enhanced.

In summary, by the providing of the diffuse surface 25 and the light-blocking protrusion 26 in the semiconductor light-emitting device 1 of the present invention, the absorption of the reflected light from the diffuse surface 25 and the light from the wavelength-converting layer 7 by the light-emitting chip 4 can be greatly decreased. Besides, by having different refractive indices for the outer and inner encapsulants layers 62, 61, the light extraction efficiency of the semiconductor light-emitting device 1 of the present invention can be enhanced. In the preferred embodiment, the reliability is also improved by an enhanced adhesion between the outer encapsulant layer 62 and the roughened diffuse surface 25 of the hollow body 2. Furthermore, the electric leakage through the heat-dissipating body 3 can be prevented by isolating the lead frame 5 from the heat-dissipating body 3.

While the present invention has been described in connection with what is considered the most practical and preferred embodiment, it is understood that this invention is not limited to the disclosed embodiment but is intended to cover various arrangements included within the spirit and scope of the broadest interpretations and equivalent arrangements.

What is claimed is:

1. A semiconductor light-emitting device comprising:
   a hollow body including a bottom wall and a surrounding wall extending upwardly from a periphery of said bottom wall, said bottom wall being formed with a through-hole, said surrounding wall cooperating with said bottom wall to define an encapsulant-receiving recess in spatial communication with said through-hole, said surrounding wall having a diffuse surface that surrounds said encapsulant-receiving recess and that has a reflectivity composed of a diffuse reflectivity and a specular reflectivity, the diffuse reflectivity being larger than the specular reflectivity;
   a heat-dissipating body provided on a bottom side of said bottom wall and covering said through-hole in said bottom wall;
   a light-emitting chip disposed in said through-hole in said bottom wall for generating a light in said hollow body, and supported on said heat-dissipating body;
   a transparent encapsulant filling said encapsulant-receiving recess and said through-hole to enclose said light-emitting chip; and
   a wavelength-converting layer that is capable of converting the wavelength of the light into a desired wavelength and that covers said transparent encapsulant.

2. The semiconductor light-emitting device of claim 1, wherein said bottom wall is formed with a light-blocking protrusion protruding from a periphery of said through-hole into said encapsulant-receiving recess for blocking a scattered light reflected from said diffuse surface from entering said through-hole in said bottom wall.

3. The semiconductor light-emitting device of claim 2, wherein said bottom side of said bottom wall is formed with an accommodating recess in spatial communication with said through-hole, said heat-dissipating body being fitted into said accommodating recess.

4. The semiconductor light-emitting device of claim 1, further comprising a lead frame connected to said light-emitting chip, disposed on an exterior of said hollow body, and spaced apart from said heat-dissipating body.

5. The semiconductor light-emitting device of claim 1, wherein said transparent encapsulant has a refractive index not greater than that of said wavelength-converting layer.

6. The semiconductor light-emitting device of claim 5, wherein the refractive index of said transparent encapsulant is not greater than that of said light-emitting chip.

7. The semiconductor light-emitting device of claim 1, wherein said transparent encapsulant has a refractive index not greater than that of said light-emitting chip.

8. The semiconductor light-emitting device of claim 1, wherein said transparent encapsulant includes inner and outer encapsulant layers, said inner encapsulant layer being received in said through-hole in said bottom wall, said outer encapsulant layer being received in said encapsulant-receiving recess, said outer encapsulant layer having a refractive index less than that of said wavelength-converting layer.

9. The semiconductor light-emitting device of claim 1, wherein said transparent encapsulant includes inner and outer encapsulant layers, said inner encapsulant layer being received in said through-hole in said bottom wall, said outer encapsulant layer being received in said encapsulant-receiving recess, said outer encapsulant layer having a refractive index less than that of said inner encapsulant layer.

10. The semiconductor light-emitting device of claim 9, wherein said inner encapsulant layer has a refractive index not greater than that of said light-emitting chip.

11. The semiconductor light-emitting device of claim 1, wherein said through-hole in said bottom wall has a rectangular periphery.

12. The semiconductor light-emitting device of claim 1, wherein said transparent encapsulant is made from a high transmittance material selected from one of a resin and a gel material.

13. The semiconductor light-emitting device of claim 12, wherein said high transmittance material is one of epoxy resin and silica gel.

14. The semiconductor light-emitting device of claim 1, wherein said diffuse surface of said surrounding wall of said hollow body is a roughened surface.

15. The semiconductor light-emitting device of claim 1, wherein said bottom side of said bottom wall is formed with an accommodating recess in spatial communication with said through-hole, said heat-dissipating body being fitted into said accommodating recess.

16. The semiconductor light-emitting device of claim 1, wherein said light-emitting chip is a light emitting diode.

17. The semiconductor light-emitting device of claim 1, wherein said hollow body is made from a composite of a polymer material and a glass fiber.

18. The semiconductor light-emitting device of claim 17, wherein said polymer material has at least one functional group selected from one of epoxy group, $C_1$-$C_6$ alkyl group, phenyl group, and amino group.

19. The semiconductor light-emitting device of claim 1, wherein said wavelength-converting layer is made from a material selected from one of a fluorescent material and a phosphorous-containing material.

20. The semiconductor light-emitting device of claim 1, wherein said heat dissipating body is made from a metallic material.

* * * * *